United States Patent
Lassmann et al.

(10) Patent No.: US 10,658,925 B2
(45) Date of Patent: May 19, 2020

(54) CIRCUIT BOARD TO TRANSFORM AN ENTRY PHASE IN AT LEAST ONE OUTPUT PHASE AND DIRECT-CURRENT-MOTOR WITH SUCH CIRCUIT BOARD

(71) Applicant: ZF Friedrichshafen AG, Friedrichshafen (DE)

(72) Inventors: Wilfried Lassmann, Hirschau (DE); Jörg Kühnl, Weiherhammer (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 16/206,455

(22) Filed: Nov. 30, 2018

(65) Prior Publication Data

US 2019/0173377 A1 Jun. 6, 2019

(30) Foreign Application Priority Data

Dec. 4, 2017 (DE) .......................... 10 2017 221 787

(51) Int. Cl.
*H02M 1/44* (2007.01)
*H05K 1/00* (2006.01)
*H02M 7/00* (2006.01)
*H02M 3/335* (2006.01)

(52) U.S. Cl.
CPC ......... *H02M 1/44* (2013.01); *H02M 3/33561* (2013.01); *H02M 3/33569* (2013.01); *H02M 7/003* (2013.01); *H05K 1/00* (2013.01)

(58) Field of Classification Search
CPC ...................................................... H02M 1/44
USPC ........................................................ 174/257
See application file for complete search history.

(56) References Cited

U.S. PATENT DOCUMENTS

2018/0048255 A1* 2/2018 Marvin .................... H02P 27/14
2018/0301959 A1* 10/2018 Wettlaufer ............... H02K 5/10

* cited by examiner

*Primary Examiner* — Stanley Tso
(74) *Attorney, Agent, or Firm* — Brinks Gilson & Lione

(57) ABSTRACT

A printed circuit board (1) for converting an input phase to at least one output phase (U,V,W), which has an input phase surface area with at least one conductive DC+ layer (28) and one conductive DC− layer (29) for each conductive DC+ layer (28), for conducting the input phase. There is at least one high-side power semiconductor (6) for each output phase (U, V, W) and one low-side power semiconductor (7) for each high-side power semiconductor (6), for switching the input phase. The at least one DC+ layer (28) corresponding to a respective DC− layer (29) is formed in a cover surface area (2), which covers at least 75% of the input phase surface area.

16 Claims, 3 Drawing Sheets

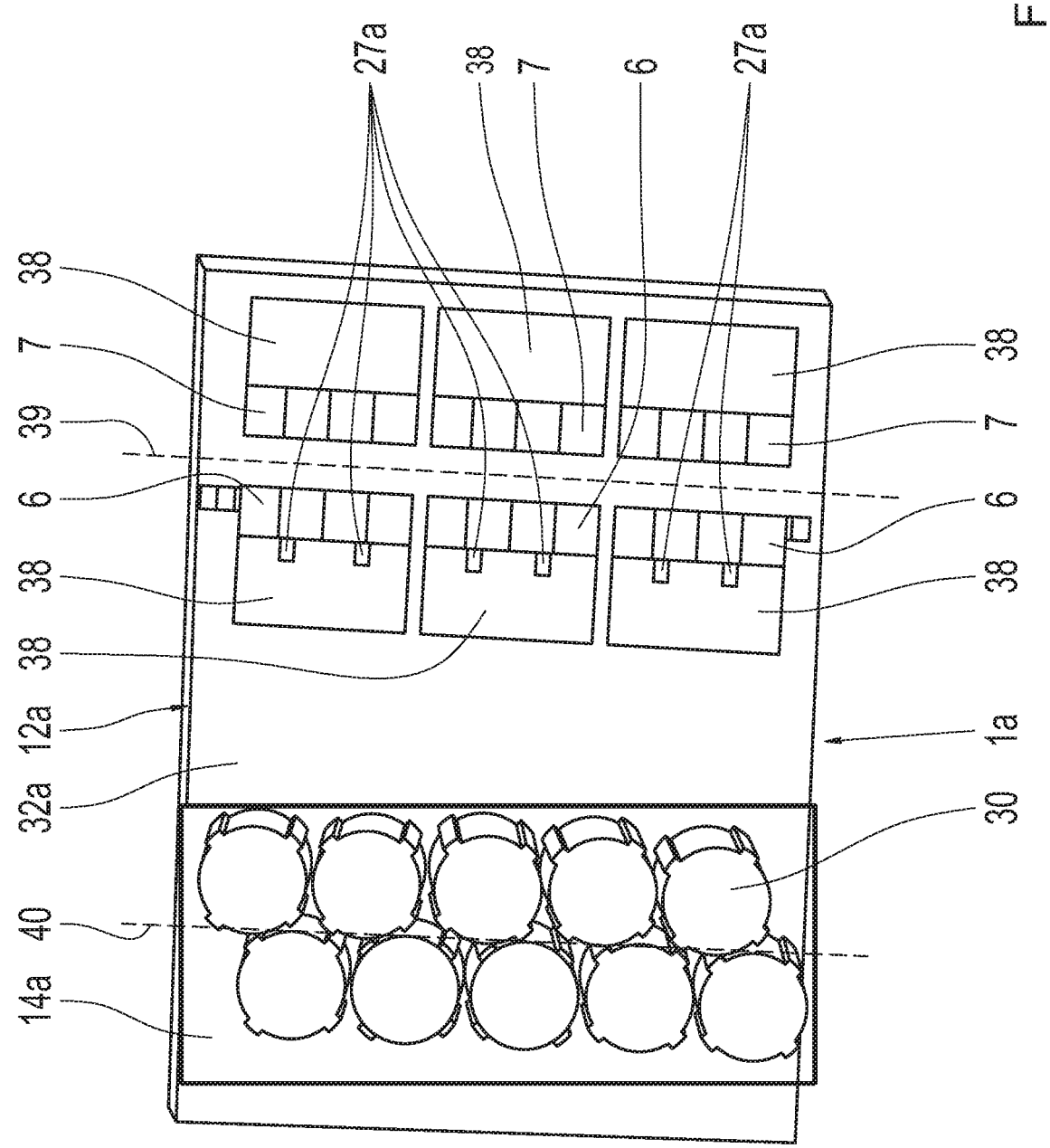

CIRCUIT BOARD TO TRANSFORM AN ENTRY PHASE IN AT LEAST ONE OUTPUT PHASE AND DIRECT-CURRENT-MOTOR WITH SUCH CIRCUIT BOARD

CROSS-REFERENCE TO RELATED APPLICATIONS

This application claims the benefit and priority of German Patent Application DE 10 2017 221 787.1, filed Dec. 4, 2017, the entirety of which is hereby fully incorporated by reference herein.

The invention relates to a printed circuit board for converting an input phase to at least one output phase. In particular, the invention relates to an inverter. The invention furthermore relates to a DC motor with such a printed circuit board.

Printed circuit boards for converting an input phase to at least one output phase are known from the prior art. They are used in particular as inverters for operating DC motors.

One object of the present invention is to create an improved printed circuit board for converting an input phase to at least one output phase, in particular to provide a printed circuit board that enables a compensation for parasitic vibrations and interference emissions generated by switching procedures.

This object is achieved by a printed circuit board that has the features given in claim 1. The printed circuit board has an input phase surface area with at least one conductive DC+ layer for conducting a DC+ potential of the input phase and one conductive DC− layer for each DC+ layer for conducting a DC− potential of the input phase. The at least one conductive DC+ layer and the at least one conductive DC− layer shall be referred to below as the at least one DC+ or DC− layer for purposes of simplicity. For each output phase, the printed circuit board also has at least one conductive high-side power semiconductor connected to the at least one DC+ layer for activating the DC+ potential and one input-side low-side power semiconductor connected to the DC− layer for each high-side power semiconductor for activating the DC− potential.

The core of the invention is that the at least one DC+ layer is formed in a cover surface area, which covers at least 75% of the input phase surface area, corresponding to the respective DC− layer.

A surface area as set forth in the present invention is a region of the printed circuit board delimited in a direction perpendicular to a surface norm of the layers, which extends along the surface norms over all of the layers of the printed circuit board. The input phase surface area is the region of the printed circuit board to which the input phase is conducted. The input phase surface area therefore represents a portion of a DC distributer circuit. At least 75% of the input phase surface area is dedicated to the cover surface area in which the at least one DC+ layer is formed corresponding to the respective DC− layer. Preferably, each DC+ layer is formed corresponding to the respective DC− layer. The formation of the DC+ layer corresponding to the respective DC− layer means that the DC− layer has the same layout of conductor paths, connectors and other structures, in particular etching structures, within production tolerances, as the DC+ layers. The corresponding configuration results in stray values in these layers, e.g. stray capacitances and leakage inductances, that are substantially equal. The stray values are symmetrical to a certain extent over the input phase surface area. This enables a compensation for the parasitic vibrations and interference emissions generated at the power semiconductors by switching procedures. In particular, overshooting in the low volt range can be stopped. The input phase can be ±48 volts, for example. In this case, it is possible to limit overshooting to 75 volts.

The structures having the same configuration preferably overlap in the cover surface area geometrically. The at least one DC+ layer is thus preferably formed such that it can be superimposed on respective DC− layer. It is also particularly preferred that the layer thickness of the at least one DC+ layer is identical to that of the respective DC− layer. In this case, the at least one DC+ layer is configured identically to the respective DC− layer. With respect to the present invention, the terms "superimposable" and "identical" are to be understood to mean that deviations or differences are covered by this within the framework of typical production tolerances.

The larger the cover surface area is in relation to the input phase surface area, the better parasitic vibrations and interference emissions can be compensated for. The cover surface area preferably covers at least 80%, in particular at least 90%, in particular at least 95% of the input phase surface area.

The power semiconductors are power switches in particular, preferably MOSFETs or IGBTs. Because overshooting can be stopped in the low volt range, the selection of possible power semiconductors and other components, e.g. surface mounted devices (SMDs), for operating the printed circuit board, is increased. In particular, more delicate components can also be used. Furthermore, no extensive filtering is required. This provides for a flexible adaptation of the components that are used. The printed circuit board can thus be produced more economically.

The output phase can be conducted out of the printed circuit board after it has been activated using the high-side power semiconductor or the low-side power semiconductor, e.g. via busbars. Alternatively, an output phase surface area can also be provided for each output phase. Conductive layers for conducting the respective output phase can be provided in an output phase surface area.

The layer structure with the at least one DC+ layer and the at least one DC− layer can be geometrically limited to the input phase surface area. Alternatively, the printed circuit board can have the same layer structure in all surface areas. The different surface areas can potentially be defined within the layers by etched structures.

The printed circuit board preferably has numerous DC+ layers and associated DC− structures. By way of example, the printed circuit board can have two DC+ layers and two DC− layers, preferably three DC+ layers and three DC− layers. The printed circuit board always has the same number of DC+ and DC− layers. All of the DC+ layers are preferably configured corresponding to the respective DC− layers in the cover surface area, wherein the various DC+ layers do not have to be configured corresponding to one another. An intermediate layer made of a dielectric material, in particular FR-4 material, preferably FR-4/99 material, can be disposed between the conductive layers for insulating purposes, in the form of a prepreg or core.

According to one aspect of the invention, the at least one DC+ layer is placed adjacent to the respective DC− layer, and is spaced no more than 200 μm, preferably no more than 150 μm away from it along the surface norms of the layers. In this context, adjacent means that the layers are only separated by an insulating intermediate layer, and no further conductive layers are disposed therebetween. The adjacent arrangement enables a capacitive arrangement of the DC+ layer and the respective DC− layer. The small spacing ensures a high capacitance of this arrangement, by means of which parasitic vibrations and interference emissions can be effectively deadened.

According to one aspect of the invention, all of the DC+ layers and all of the DC− layers can be superimposed in the cover surface area; in particular, they have the same design. This improves the symmetry and thus the compensating effects.

According to one aspect of the invention, all of the DC+ layers are disposed alternating with the DC− layers. This increases the symmetry and capacitance of the DC+ layers and the DC− layers, enabling improved compensation.

According to one aspect of the invention, the at least one DC+ layer and the respective DC− layer are in the form of thick copper plies. High currents can be conducted in thick copper plies. The thick copper plies also enable an effective heat dissipation. The at least one DC+ layer and the respective DC− layer have a thickness of at least 105 μm, in particular a thickness of approx. 210 μm.

According to one aspect of the invention, at least one intermediate circuit capacitor is disposed in the input phase surface area. The input phase surface area with at least one intermediate circuit capacitor fulfills the function of an intermediate circuit. Energy for switching peaks can be temporarily stored in the intermediate circuit capacitor. Furthermore, voltage peaks of the parasitic vibrations and interference emissions can be absorbed more effectively.

According to one aspect of the invention, the cover surface area comprises at least a portion of an infeed surface area of the input phase surface area. In other words, the cover surface area covers the infeed surface area at least in part. The infeed surface area conducts the input phase from the at least one intermediate circuit capacitor to the at least one high-side power semiconductor and/or the at least one low-side power semiconductor. The infeed surface area is particularly relevant to the compensation for parasitic vibrations and interference emissions generated at the power semiconductors by switching procedures. A substantially symmetrical configuration of the at least one DC+ layer and the respective DC− layer in the infeed surface area ensures a particularly effective compensation for the parasitic vibrations and interference emissions. The cover surface area preferably comprises at least 75%, in particular at least 80%, in particular at least 90%, preferably at least 95%, of the infeed surface area. In some embodiments, the cover surface area can also be formed entirely within the infeed surface area.

According to one aspect of the invention, the printed circuit board has at least one conductive commutation circuit layer connected to the at least one high-side power semiconductor and/or the respective low-side power semiconductor. There are preferably two commutation circuit layers. The commutation circuit layers enable a low-inductance connection of the power semiconductor, by means of which voltage surges are minimized when switching off the power semiconductor. The commutation circuit layers thus also contribute in compensating for parasitic vibrations and interference emissions. The commutation circuit layers preferably include commutation circuit capacitors, by means of which a more effective deadening of parasitic vibrations and interference emissions is ensured.

According to one aspect of the invention, the at least one commutation circuit layer is formed in a part of the cover surface area corresponding to the at least one DC+ layer. The at least one commutation circuit layer is preferably formed in the entire cover surface area corresponding to the at least one DC+ layer. The symmetry also extends through this to the at least one commutation circuit layer. The symmetrical arrangement and the low-inductance connection via the at least one commutation circuit layer act together in a synergetic manner. The compensation for parasitic vibrations and interference emissions is particularly effective.

According to one aspect of the invention, the printed circuit board has at least one control circuit layer for activating the at least one high-side power semiconductor and/or the respective low-side power semiconductor. The printed circuit board thus has an output region and a control region, and fulfills different functions therewith. In addition, a compact configuration of the printed circuit board with different functional regions is ensured. There is preferably a control circuit layer for each high-side power semiconductor and each low-side power semiconductor.

According to one aspect of the invention, the input phase can be converted to at least two, preferably three, output phases. The printed circuit board is thus particularly suitable for operating a three-phase DC motor.

According to one aspect of the invention, the printed circuit board has numerous high-side power semiconductors and respective low-side power semiconductors for each output phase. The number of low-side power semiconductors corresponds to the number of high-side power semiconductors. By providing numerous power semiconductors, high currents can be broken down into partial currents, and activated as such.

According to one aspect of the invention, all of the high-side power semiconductors and/or all of the low-side power semiconductors are disposed along a circuitry arc delimiting, at least in sections, the input phase surface areas. The circuitry arc runs along a transition from the input phase surface area to an output phase surface area of the printed circuit board. Due to the shape of the circuitry arc, the input phase surface area exhibits, at least in sections, a circular symmetry. This enables symmetrically distributed, in particular identical, surface portions, via which the current is conducted to the power switches. The symmetry of the input phase surface area is further increased, by means of which the deadening of parasitic vibrations and interference emissions is further improved.

According to one aspect of the invention, numerous intermediate circuit capacitors are disposed along an intermediate circuit arc. The intermediate circuit arc is concentric to the circuitry arc and has a smaller radius. The intermediate circuit capacitors are disposed inside the input phase surface area, and at a uniform spacing to the power semiconductor. This results in an improved symmetry of the input phase surface area. The synergetic effects obtained thereby, between the intermediate circuit capacitors and the symmetrical configuration of the input phase surface area, result in a particularly effective compensation for the parasitic vibrations and interference emissions.

An infeed surface area of the input phase surface area is formed between the circuitry arc and the intermediate circuit arc. The cover surface area preferably comprises, as described above, at least a part of the infeed surface area.

In an alternative embodiment, the power semiconductors are disposed along a circuitry line and the intermediate circuit capacitors are disposed along an intermediate circuit line. The intermediate circuit line and the circuitry line are preferably parallel to one another. An infeed surface area is thus defined in which the current of the input phase conducted from the intermediate circuit capacitors to the power semiconductors covers the same distances.

The printed circuit board described above converts an input phase to at least one output phase. Thus, at least one output phase for operating a device, in particular a DC motor, can be provided via the printed circuit board. If the device, in particular the DC motor, is not operated by the output phase, current can be conducted from the device back to the printed circuit board. In this case, the printed circuit board can switch the returned current to a phase corresponding to the input phase. This phase can be returned to a supply network or a supply battery. The printed circuit board is therefore suitable for recuperation. In particular, a DC motor connected to the printed circuit board can function as a generator when the output rotates, wherein the printed circuit board converts the generated and returned current into a phase corresponding to the input phase.

A further object of the invention is to provide an improved DC motor, in particular a DC motor in which parasitic vibrations and interference emissions are compensated for.

This object is achieved by a DC motor that has the features given in claim 15. The DC motor has a printed circuit board of the type described above. The printed circuit board converts an input phase into at least one output phase, and provides this for operating the DC motor. Particularly preferably, all of the phases for operating the DC motor are provided by the printed circuit board.

The DC electric motor can be a three-phase DC motor in particular. The DC motor is particularly preferably a three-phase brushless motor. The further advantages of the DC motor correspond to the advantages of the printed circuit board described above.

Further features, advantages and details of the invention can be derived from the exemplary embodiments described below based on the drawings. Therein:

FIG. 3 shows a top view of a further exemplary embodiment of a printed circuit board.

Figure 1:
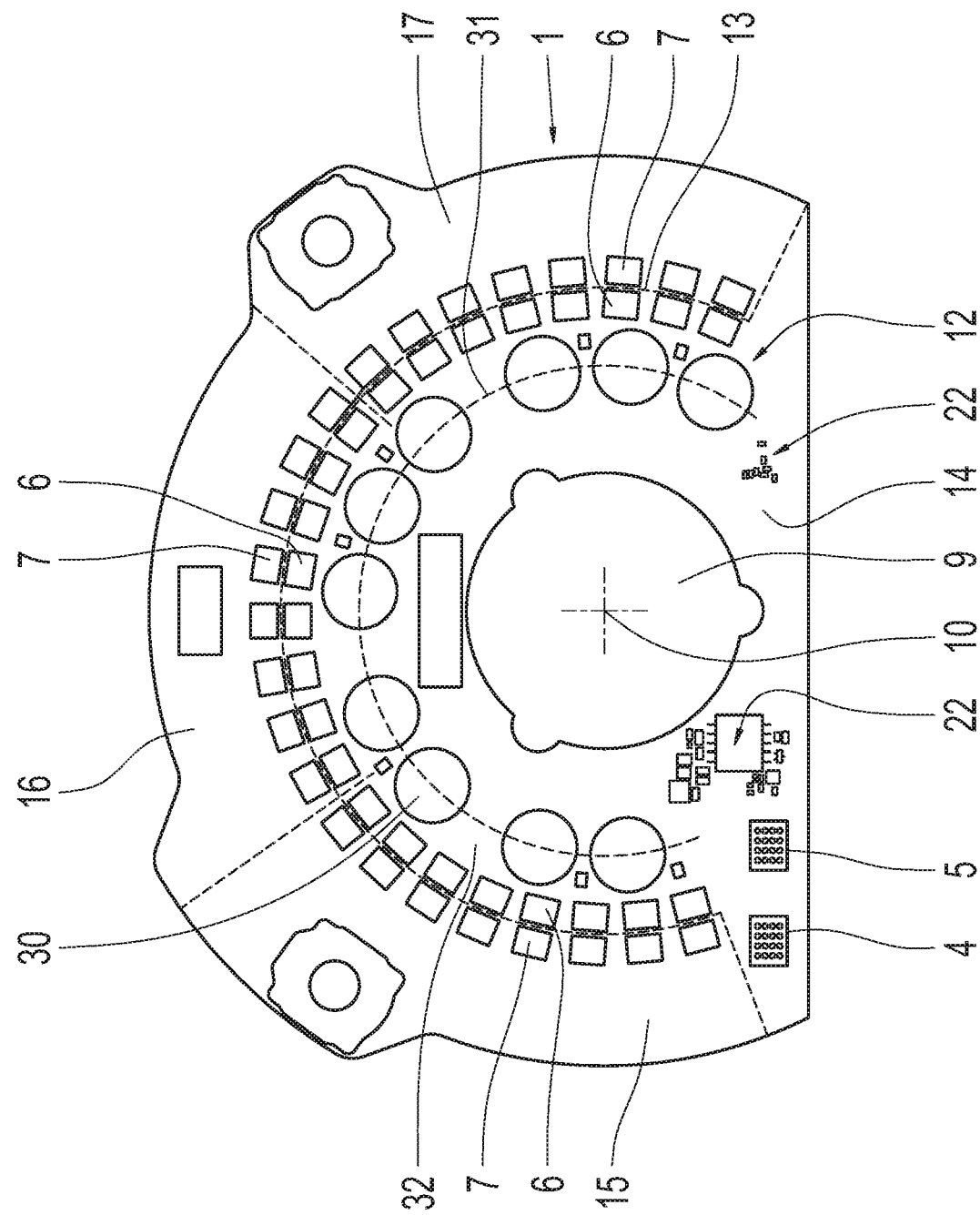
FIG. 1 shows a schematic view of a printed circuit board.
Figure 2:
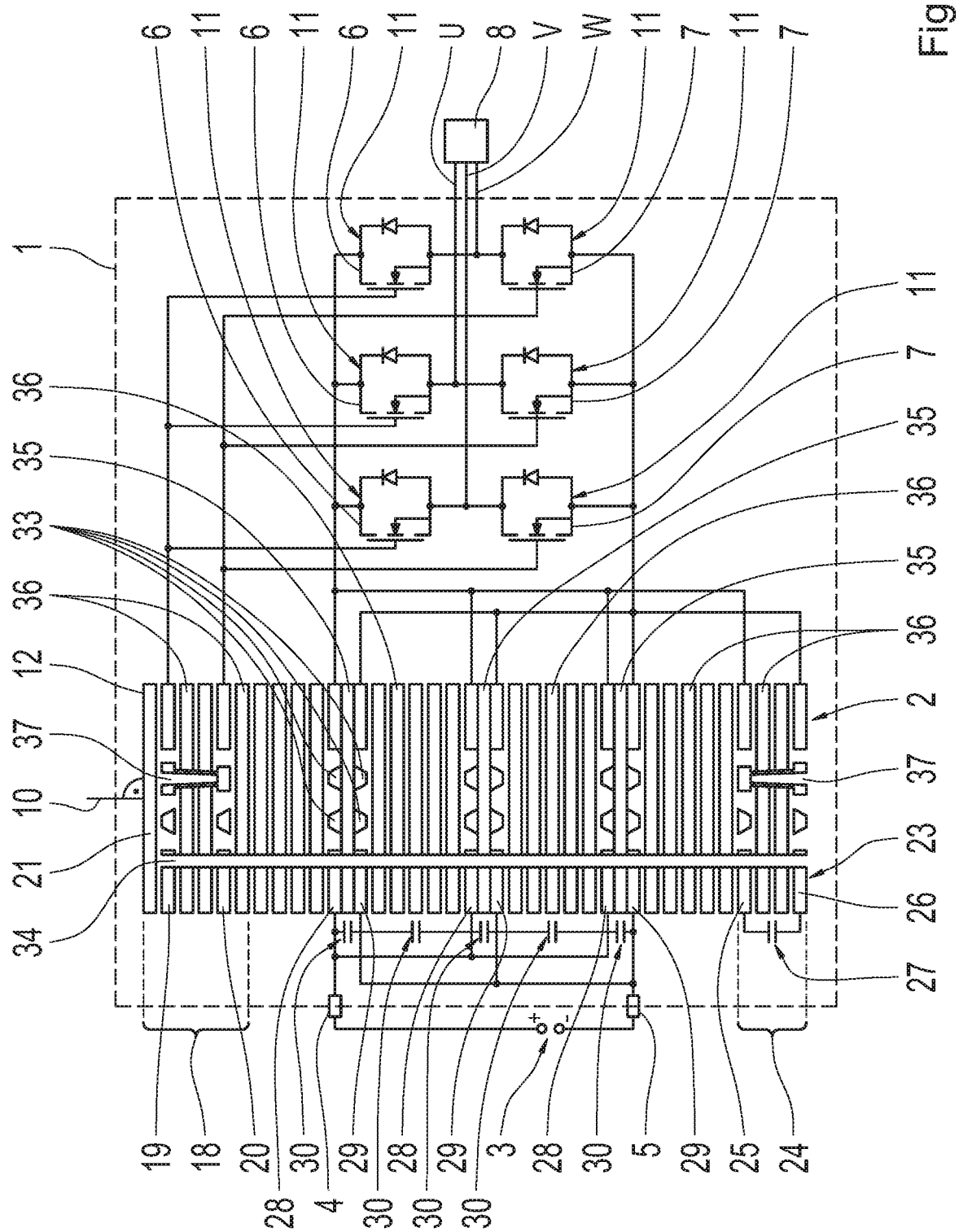
FIG. 2 shows schematically, a layer structure within a cover surface area, and schematically, a wiring of components of the printed circuit board according to FIG. 1.

A first exemplary embodiment of the printed circuit board 1 is illustrated in FIGS. 1 and 2. The printed circuit board 1 is shown in FIG. 1 in a schematic top view. FIG. 2 schematically illustrates the wiring of the printed circuit board, wherein a layer structure of the printed circuit board 1 is also schematically illustrated in a cover surface area 2 that shall be described below.

The printed circuit board 1 is connected to a power source 3. The input phase provided via the power source 3 has a DC+ polarization and a DC− polarization. The respective polarizations are conducted to the printed circuit board 1 via a DC+ insert 4 and a DC− insert 5.

The printed circuit board 1 has high-side power semiconductors 6 and low-side power semiconductors 7. The power semiconductors 6, 7 are formed as MOSFETs. The high-side power semiconductor 6 and the low-side power semiconductor 7 enable a switching of the DC+ potential or the DC− potential of the input phase to three output phases U, V, W. The output phases U, V, W are connected to a DC motor 8, schematically shown in FIG. 2. The printed circuit board can therefore operate the DC motor 8. The DC motor 8 is a brushless three-phase DC motor. An input phase of ±48 volts is provided for operating the DC motor 8. The printed circuit board can be mounted directly on the DC motor 8. The printed circuit board 1 has a drive shaft hole 9 for a drive shaft of the DC motor 8 for this. The drive shaft of the DC motor 8 extends along a surface norm 10 of the layers of the printed circuit board 1.

For each output phase U, V, W in the circuit diagram shown in FIG. 2, only one high-side power semiconductor 6 and one low-side power semiconductor 7 are shown a part of a half bridge 11 in each case, for purposes of clarity. It can be seen in FIG. 1, however, that each output phase U, V, W has eight high-side power conductor semiconductors 6 and just as many low-side power semiconductors 7, wherein just one high-side power semiconductor 6 and one low-side power semiconductor 7 for each output phase U, V, W are provided with a reference symbol, for purposes of clarity. With numerous power semiconductors 6, 7 it is possible to break down the total current into different partial currents, in order to thus be able activation of all of the currents. The power semiconductors 6, 7 are disposed on the upper surface of the printed circuit board 1. The power semiconductors 6, 7 are disposed along a circuitry arc 13 indicated by a broken line in FIG. 1. The circuitry arc 13 delimits an input phase surface area 14, at least in sections, in which the input phase is conducted from the inserts 4, 5 to the power semiconductors 6, 7. Output phase surface regions 15, 16, 17 are disposed outside the input phase surface area 14. The output phases U, V and W are conducted to the output phase surface areas 15, 16, 17. The boundaries between the input phase surface area 14 and the output phase surface areas 15, 16, 17 are indicated by a broken line in FIG. 1.

The layer structure of the printed circuit board 1 in the cover surface area 2, which is part of the input phase surface area 14, is schematically illustrated in FIG. 2. The printed circuit board 1 also has a similar layer structure in the output phase surface areas 15, 16, 17. The input phase surface area 14 is separated from the output phase surface areas 15, 16, 17 within the layers of the printed circuit board 1 by etched structures. The printed circuit board 1 has ten conductive layers.

A control circuit stratum 18 contains the control circuit layers 19, 20. The control circuit layer 18 is disposed directly adjoining a solder resist layer 21 on the upper surface of the printed circuit board 1. The control circuit layer 19 activates the high-side power semiconductor 6, while the control circuit layer 20 activates the low-side power semiconductor 7. For this, the control circuit layer 19 is connected to the gate connections of the high-side power semiconductor 6, and the control circuit layer 20 is connected to the gate connections of the low-side power semiconductor 7. Further surface mounted devices (SMDs) 22 can be disposed on the upper surface of the printed circuit board 1, which process control signals sent to the control circuit stratum 18. The control circuit layers 19, 20 are made of copper. The control circuit layer 20 has a layer thickness of approx. 70 µm. The control circuit layer 19 is made of copper foil with a layer thickness of approx. 18 µm.

A commutation circuit stratum 24, with commutation circuit layers 25, 26, is disposed on an undersurface 23 of the printed circuit board 1 lying opposite the upper surface. The commutation circuit layers 25, 26 are connected conductively to the high-side power semiconductors 6 and the low-side power semiconductors 7. The commutation circuit layers 25, 26 are made of copper. The commutation circuit layer 25 is a copper foil with a layer thickness of approx. 70 µm. The commutation circuit layer 26 is a copper foil with a layer thickness of approx. 18 µm.

Commutation circuit capacitors 27 interconnect the commutation circuit layers 25, 26. Only one commutation circuit capacitor 27 is shown schematically in FIG. 2. Nevertheless, one commutation circuit capacitor 27 is provided for each pair of power semiconductors comprising a high-side power semiconductor 6 and a low-side power semiconductor 7. The commutation circuit capacitors are disposed in the region of the high-side power semiconductor 6 and the low-side power semiconductor 7. For purposes of clarity, the commutation circuit capacitors 26 are not explicitly shown in FIG. 1. A low inductance connection of the power semiconductors 6, 7 is ensured by the commutation circuit stratum 24 and the commutation circuit capacitors 27.

There are three DC+ layers 28 and three DC− layers 29 to conduct the DC+ potential and the DC− potential of the input phase from the respective inserts 4, 5 to the high-side power semiconductors 6 and the low-side power semiconductors 7. All of the DC+ layers 28 and DC− layers 29 are formed by thick copper plies. The DC+ layers 28 and DC− layers 29 have a layer thickness of approx. 210 μm. All of the DC+ layers 28 and DC− layers thus have the same layer thickness, within the framework of production tolerances. The DC+ layers 28 and DC− layers 29 are disposed in an alternating manner, and in pairs. The capacitance of the DC+ layers 28 and DC− layers 29 is increased by the alternating arrangement.

Intermediate circuit capacitors interconnect the DC+ layers 28 and DC− layers 29. Only five intermediate circuit capacitors 20 are indicated by way of example in FIG. 2. As can be seen in FIG. 1, however, there are ten intermediate circuit capacitors 30 disposed on the upper surface 12 of the printed circuit board 1. Only one of the ten intermediate circuit capacitors 30 is provided with a reference symbol in FIG. 1, for purposes of clarity. The intermediate circuit capacitors 30 are disposed along an intermediate circuit arc 31, indicated in FIG. 1 by a broken line. The intermediate circuit arc 31 is concentric to the circuitry arc 13, and has a smaller radius. The intermediate circuit arc 31 is therefore formed entirely inside the input phase surface area 14. The intermediate circuit capacitors 30 are disposed inside the input phase surface area 14. An infeed surface area 32 is defined between the intermediate circuit arc 31 and the circuitry arc 13, in which the input phase is conducted from the intermediate circuit capacitors 30 to the high-side power semiconductors 6 and the low-side power semiconductors 7. The infeed surface area 32 is part of the input phase surface area 14.

The cover surface area 2 is formed in the input phase surface area 14. The cover surface area 2 covers at least 75% of the input phase surface area 14. The cover surface area 2 comprises a part of the infeed surface area 32. The cover surface area 2 comprises at least 75% of the infeed surface area 32. Each DC+ layer 28 corresponding to the respective DC− layer 29 is formed in the cover surface area 2. The schematic layer structure in FIG. 2 shows the DC+ layers 28 and the respective DC− layers 29 in the cover surface area 2. The corresponding configuration is ensured in that the DC+ layers 28 and the respective DC− layers 29 have the same configurations of conductor paths 33, connectors, e.g. the thermal connection 34, and other etched structures within the production tolerances of the printed circuit board. The same configurations result in substantially equal the stray values, e.g. stray capacitances and leakage inductances, in the DC+ layers 28 and the respective DC− layers 29. This symmetry ensures a compensation for the parasitic vibrations and interference emissions generated by the switching procedures caused at the power semiconductors 6, 7. Overshooting can be stopped in the low voltage range. Overshooting up to 75 volts can be stopped for the input phase of ±48 volts.

The symmetry of the DC+ layers 28 and DC− layers 29 in the cover surface area 2 of the input phase surface area 14 is further increased in that all DC+ layers 28 and all DC− layers 29 have corresponding configurations of conductor paths 33, connectors 34 and further etched structures. The corresponding structures 33, 34 are formed within the framework of production tolerances such that they are the same size and shape as the printed circuit board 1. Because of the substantially equal layer thicknesses of the DC+ layers 28 and the DC− layers 29, they are actually identical in the cover surface area 2 within the framework of the production tolerances.

Each of the DC+ layers 28 is adjacent to the respective DC− layer 29. This means that there are no further conductive layers between the DC+ layers 28 and the respective DC− layers 29. A dialectic core 35 made of FR 4/99 material is disposed between each DC+ layer 28 and the respective DC− layer 29. The dielectric core 35 has a thickness of approx. 150 μm. The DC+ layers 28 and the respective DC− layers 29 are therefore only slightly spaced apart along the surface norms 10, thus improving their capacitance.

Dielectric prepreg layers 36 are disposed between the other conductive layers of the printed circuit board. The dielectric prepreg layers are composed of FR 4/99 material and have a layer thickness of approx. 59 μm in each case. Numerous dielectric prepreg layers 36 are disposed above one another between the conductive layers in each case. Only one dielectric prepreg layer 36 is provided with a reference symbol in FIG. 2, for purposes of clarity. Two dielectric prepreg layers 36 are disposed between each of the control circuit layers 19, 20 and between each of the commutation circuit layers 25, 26. Five dielectric prepreg layers 36 are disposed between each of the further conductive layers, in particular the DC+ layers 28 and the DC− layers 29, between which no dielectric core 35 is disposed. As a result, the thickness and thus the stability of the printed circuit board 1 is increased.

As can be derived from the schematic layer construction in FIG. 2, the commutation circuit stratum 24 is formed corresponding to the DC+ layers 28 and the DC− layers 29 in a part of the cover surface area 2. This further increases the symmetry of the input phase surface area 14, and ensures an even more effective compensation for parasitic vibrations and interference emissions. The commutation circuit stratum 24 as well as the control circuit stratum 18 can be formed inside the cover surface area 2, deviating from the DC+ layers 28 and the DC− layers 29. By way of example, the commutation circuit stratum 24 and the control circuit stratum 18 can include other structures, such as connectors 37.

A schematic top view of another exemplary embodiment of a printed circuit board 1a is shown in FIG. 3. Components that have already been explained in the context of the printed circuit board 1 illustrated in FIGS. 1 and 2 have the same reference symbols. Structurally different, but functionally identical components have the same reference symbol with a "a" appended thereto.

The printed circuit board 1a has the same layer structure as the printed circuit board 1. They differ, however, in terms of their geometric shapes. The printed circuit board 1a has a rectangular shape. For this reason, the input phase surface area 14a is also rectangular.

The printed circuit board 1a converts the input phase into three output phases U, V, W. For this, four high-side power semiconductors 6 and four low-side power semiconductors 7 are provided for each output phase. For purposes of clarity, only one high-side power semiconductor 6 and one low-side power semiconductor 7 for each output phase U, V, W is provided with a reference symbol. The power semiconductors 6, 7 are MOSFETs. Bus bars 38 are provided for conducting the output phases U, V, W.

Commutation circuit capacitors 27a in the form of SMD components are disposed in the regions of the power semiconductors 6, 7 and the bus bars 38. There is one commutation circuit capacitor 27a for every two high-side power semiconductors 6 and two low-side power semiconductors 7.

The power semiconductors 6, 7 and the bus bars 38 are disposed along a circuitry line 39. Likewise, the intermediate circuit capacitors are disposed along an intermediate circuit line 40. The circuitry lines 39 and the intermediate lines 40 are indicated in FIG. 3 by broken lines. The infeed surface area 32a is formed between the intermediate lines 40 and the circuitry lines 39.

Further exemplary embodiments, not shown, have another layer structure for the printed circuit board. By way of example, there may only be two DC+ layers and two DC− layers. In other exemplary embodiments there are more than three DC+ layers and just as many associated DC− layers. In all of the exemplary embodiments, the number of DC− layers corresponds to the number of DC+ layers. In other exemplary embodiments a dielectric core, e.g. a 150 μm thick core made of FR 4/99 material can be disposed between all of the DC+ layers and all of the DC− layers. This further increases the capacitance of the DC+ layers and the DC− layers.

REFERENCE SYMBOLS 1, 1a printed circuit board
2 cover surface area
3 power source
4 DC+ insert
5 DC− insert
6 high-side power semiconductor
7 low-side power semiconductor
8 DC motor
9 drive shaft hole
10 surface norm
11 half bridge
12, 12a upper surface of the printed circuit board
13 circuitry arc
14, 14a input phase surface area
15 output phase surface area (output phase U)
16 output phase surface area (output phase V)
17 output phase surface area (output phase W)
18 control circuit stratum
19 control circuit layer (high-side)
20 control circuit layer (low-side)
21 solder resist layer
22 surface mounted devices (SMDs)
23 undersurface of the printed circuit board
24 commutation circuit stratum
25 commutation circuit layer
26 commutation circuit layer
27, 27a commutation circuit capacitor
28 DC+ layer
29 DC− layer
30 intermediate circuit capacitor
31 intermediate circuit arc
32, 32a infeed surface area
33 conductor path
35 dielectric core
36 dielectric prepreg layer
37 connectors
38 bus bar
39 circuitry line
40 intermediate circuit line

The invention claimed is:

1. A printed circuit board for converting an input phase to at least three output phases, the printed circuit board comprising:
an input phase region having an input phase region surface area of the printed circuit board, the input phase region comprising:
at least one conductive DC+ layer for conducting a DC+ potential of an input phase;
at least one conductive DC− layer for conducting a DC− potential of the input phase, wherein a number of the at least one conductive DC+ layer is the same as a number of the at least one conductive DC− layer;
at least one conductive high-side power semiconductor connected to the at least one conductive DC+ layer for each output phase and configured to activate the DC+ potential; and
at least one conductive low-side power semiconductor connected to the at least one conductive DC− layer for each output phase and configured to activate the DC− potential, wherein a number of the at least one conductive high-side power semiconductor is the same as a number of the at least one conductive low-side power semiconductor,
wherein the at least one conductive DC+ layer has a first conductor path layout, and wherein the at least one conductive DC− layer has a second conductor path layout, wherein a cover surface area consists of areas of the printed circuit board where the first conductor path layout overlaps with the second conductor path layout,
wherein the cover surface area within the input phase region comprises at least 75% of the input phase region surface area.

2. The printed circuit board according to claim 1, wherein the at least one conductive DC+ layer is disposed adjacent to the respective at least one conductive DC− layer, and is spaced apart therefrom in a direction of surface norms of the at least one conductive DC+ layer and the at least one conductive DC− layer by no more than 200 μm.

3. The printed circuit board according to claim 1, wherein the first conductor path layout and the second conductor path layout of all of the at least one conductive DC+ layer and all of the at least one conductive DC− layer are the same size and shape in the cover surface area.

4. The printed circuit board according to claim 1, wherein all of the at least one conductive DC+ layer and the at least one conductive DC− layer are disposed in an alternating manner.

5. The printed circuit board according to claim 1, wherein the at least one conductive DC+ layer and the at least one conductive DC− layer are formed by copper plies having a thickness of at least 105 μm.

6. The printed circuit board according to claim 1, wherein at least one intermediate circuit capacitor is disposed in the input phase region.

7. The printed circuit board according to claim 6, wherein the input phase region comprises an infeed region in which the input phase is conducted from the at least one intermediate circuit capacitor to the at least one high-side power semiconductor and the at least one low-side power semiconductor via the at least one conductive DC+ layer and the at least one conductive DC− layer, and wherein the cover surface area exists in at least part of the infeed region.

8. The printed circuit board according to claim 1, further comprising:

at least one conductive commutation circuit layer connected to the at least one high-side power semiconductor and the at least one low-side power semiconductor.

9. The printed circuit board according to claim 8, wherein the at least one commutation circuit layer has at least a third conductor path layout that is formed at least in a part of the cover surface area.

10. The printed circuit board according to claim 1, further comprising:
at least one control circuit layer for activating the at least one high-side power semiconductor and the at least one low-side power semiconductor.

11. The printed circuit board according to claim 1, wherein the printed circuit board is configured to convert the input phase to the at least three output phases.

12. The printed circuit board according to claim 1, wherein the at least one high-side power semiconductor comprises a plurality of high-side power semiconductors and wherein the at least one low-side power semiconductor comprises a plurality of low-side power semiconductors.

13. The printed circuit board according to claim 12, wherein the plurality of high-side power semiconductors and the plurality of low-side power semiconductors are disposed along a circuitry arc delimiting, at least in sections, the input phase region of the printed circuit board.

14. The printed circuit board according to claim 13, further comprising:
a plurality of intermediate circuit capacitors, which are disposed along an intermediate arc that is concentric to the circuitry arc, and which has a smaller radius than the circuitry arc.

15. A DC motor comprising the printed circuit board according to claim 1 for providing at least one output phase of the at least three output phases for operating the DC motor.

16. The printed circuit board according to claim 1, wherein the at least one conductive DC+ layer and the at least one conductive DC− layer are formed by copper plies having a thickness of at least 210 µm.

* * * * *